(12) United States Patent
Johnson et al.

(10) Patent No.: US 6,303,899 B1
(45) Date of Patent: Oct. 16, 2001

(54) METHOD AND APPARATUS FOR SCRIBING A CODE IN AN INACTIVE OUTER CLEAR OUT AREA OF A SEMICONDUCTOR WAFER

(75) Inventors: Gregory A. Johnson; Kunal N. Taravade, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/209,855

(22) Filed: Dec. 11, 1998

(51) Int. Cl.[7] ................................................. B23K 26/38
(52) U.S. Cl. ............................... 219/121.69; 219/121.68; 438/462
(58) Field of Search ........................... 219/121.68, 121.8, 219/121.82, 121.69; 438/401, 462

(56) References Cited

U.S. PATENT DOCUMENTS

| | | | |
|---|---|---|---|
| Re. 33,947 | 6/1992 | Shinohara | 156/643 |
| 3,814,895 | 6/1974 | Fredriksen | 219/121.6 |
| 4,328,553 * | 5/1982 | Frederiksen et al. | |
| 4,543,464 | 9/1985 | Takeuchi | 219/121.68 |
| 4,685,206 * | 8/1987 | Kobayashi et al. | |
| 4,747,093 | 5/1988 | Benne et al. | 369/280 |
| 4,933,205 | 6/1990 | Duley et al. | 427/53.1 |
| 5,175,774 * | 12/1992 | Traux et al. | |
| 5,206,181 | 4/1993 | Gross | 437/8 |
| 5,256,578 | 10/1993 | Corley et al. | 437/8 |
| 5,329,090 * | 7/1994 | Woelki et al. | 219/121.68 |
| 5,365,672 * | 11/1994 | Kato | |
| 5,543,365 | 8/1996 | Wills et al. | 437/226 |
| 5,808,268 * | 9/1998 | Balz et al. | 219/121.8 |
| 5,956,596 * | 9/1999 | Jang et al. | |
| 5,999,252 * | 12/1999 | Greisz | |
| 6,004,405 * | 12/1999 | Oishi et al. | 438/401 |

FOREIGN PATENT DOCUMENTS

| | | | |
|---|---|---|---|
| 2133352 | * | 7/1984 | (GB) . |
| 57-175092 | * | 10/1982 | (JP) . |

* cited by examiner

Primary Examiner—Geoffrey S. Evans

(57) ABSTRACT

A method of fabricating a semiconductor wafer having an active area and an inactive outer clear out area includes the step of fabricating a number of active dies on a first side of the wafer such that each of the number of active dies is completely contained within the active area of the wafer. The method also includes the step of generating a laser beam with a laser device. Moreover, the method includes the step of scribing a code in the inactive outer clear out area of the wafer with the laser beam such that the code is completely contained within the inactive outer clear out area of the wafer. An apparatus for scribing a code in an inactive outer clear out area of a first side of a semiconductor wafer is also disclosed.

16 Claims, 6 Drawing Sheets

METHOD AND APPARATUS FOR SCRIBING A CODE IN AN INACTIVE OUTER CLEAR OUT AREA OF A SEMICONDUCTOR WAFER

TECHNICAL FIELD OF THE INVENTION

The present invention relates generally to semiconductor wafer fabrication, and more particularly to a method and apparatus for scribing a code in an inactive outer clear out area of a semiconductor wafer.

BACKGROUND OF THE INVENTION

The manufacture of semiconductor wafers to create semiconductor integrated circuit devices typically involves a sequence of processing steps which fabricate the multi-layer structure generally associated with the integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal. Hence, the manufacture of a first type of semiconductor wafer may include a large number of processing steps which are different relative to the processing steps required to fabricate a second type of semiconductor wafer. Since many different types of semiconductor devices (e.g. different part numbers) are often manufactured in the same facility, it is necessary to identify or otherwise mark each individual semiconductor wafer so that it may be distinguished from wafers of a different type. In particular, it is necessary to mark individual wafers with an identification code which includes, for example, the part number of the integrated circuit devices contained in the wafer, the date code of the wafer, and the lot number of the wafer.

One manner of marking semiconductor wafers is to scribe the identification code in the wafer via laser ablation. In particular, a focused laser beam from a laser device, such as an excimer laser device, is impinged on the front side of the semiconductor wafer so as to scribe the identification code in the front side of the wafer. For example, as shown in FIG. 8, laser scribing devices which have heretofore been designed disadvantageously scribe an identification code 100 in a semiconductor wafer 102 in a linear fashion. Hence, the identification code is not completely contained within an inactive outer clear out area 104. The inactive outer clear out area 104 is a "clear out" area which is generally not fabricated to include a resist layer or the like so as to prevent certain types of fabrication defects. Scribing the identification code such that a portion of the code is not completely contained within the inactive outer clear out area 104 has a number of drawbacks associated therewith. Firstly, the usable surface area within an active area 106 of the semiconductor wafer is undesirably decreased since a portion 108 of the identification code 100 is scribed therein. Moreover, residual resist from a photolithography step may be deposited and thereafter expelled from the pits associated with the portion 108 of the identification code 100 located in the active area 106 of the semiconductor wafer 102 thereby undesirably generating contaminants during subsequent processing steps.

In addition, in certain manufacturing processes, semiconductor wafers are sorted via use of an optical character recognition (OCR) device which reads the identification code scribed in the wafer 102. Use of such an OCR device is complicated by the differing background colors and/or topographies associated with the portion 108 of the identification code 100 which is located in the active area 106 and a portion 110 of the identification code 100 which is located in the inactive outer clear out area 104.

Thus, a continuing need exists for a wafer scribing apparatus and method which overcomes one or more of the above mentioned drawbacks.

SUMMARY OF THE INVENTION

In accordance with one embodiment of the present invention, there is provided a method of fabricating a semiconductor wafer. The method includes the step of generating a laser beam with a laser device. Moreover, the method includes the step of scribing a code in an inactive outer clear out area of a first side of the wafer with the laser beam such that the code is completely contained within the inactive outer clear out area of the wafer.

Pursuant to another embodiment of the present invention, there is provided a method of fabricating a semiconductor wafer having an active area and an inactive outer clear out area. The method includes the step of fabricating a number of active dies on a first side of the wafer such that each of the number of active dies is completely contained within the active area of the wafer. The method also includes the step of generating a laser beam with a laser device. Moreover, the method includes the step of scribing a code in the inactive outer clear out area of the wafer with the laser beam such that the code is completely contained within the inactive outer clear out area of the wafer.

Pursuant to yet another embodiment of the present invention, there is provided an apparatus for scribing a code in a first side of a semiconductor wafer. The apparatus includes a movable stage device configured to engage the wafer by a second side of the wafer. The apparatus also includes a laser device positioned such that a laser beam generated by the laser device is impinged on the first side of the wafer when the wafer is positioned within the stage device. The stage device is further configured to position the wafer in a number of predetermined locations relative to the laser device such that impingement of the laser beam on the first side of the wafer causes the code to be scribed in an inactive outer clear out area of the first side of the wafer. The code is completely contained within the inactive outer clear out area of the wafer.

Pursuant to another embodiment of the present invention, there is provided a semiconductor wafer. The semiconductor wafer includes an active area having a number of active dies contained therein such that each of said number of active dies is completely contained within said active area. Moreover, the semiconductor wafer includes an inactive outer clear out area having a code disposed therein such that said code is completely contained within said inactive outer clear out area.

It is an object of the present invention to provide an improved method and apparatus for scribing a code in a semiconductor wafer.

It is an object of the present invention to provide a new and useful method and apparatus for scribing a code in a semiconductor wafer.

It is a further object of the present invention to provide a method and apparatus for scribing a code in a semiconductor wafer which does not scribe any portion of the code in an active area of the semiconductor wafer.

The above and other objects, features, and advantages of the present invention will become apparent from the following description and the attached drawings.

DETAILED DESCRIPTION OF A PREFERRED EMBODIMENT

Figure 1:
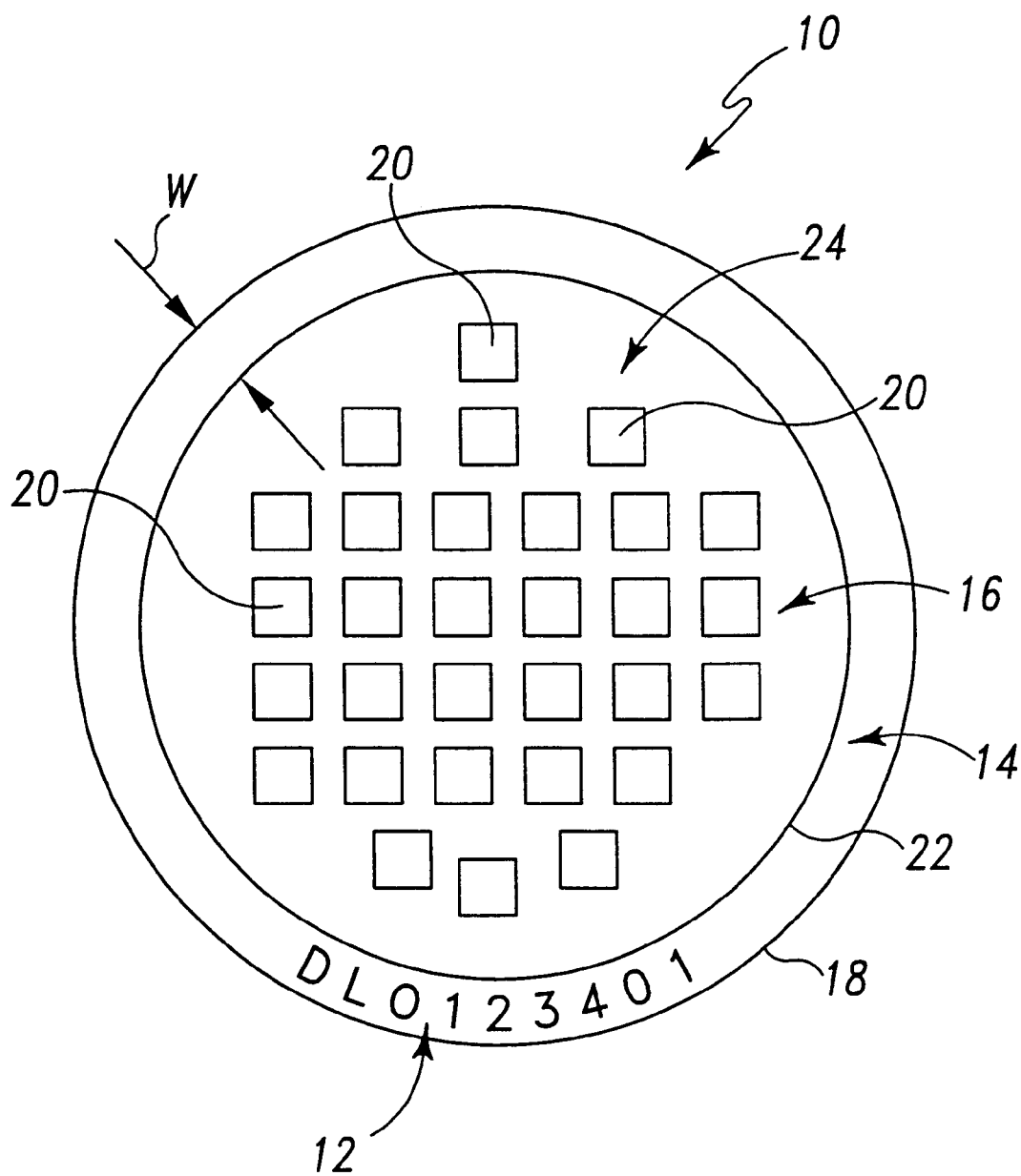
FIG. 1 is a plan view of a semiconductor wafer having a code scribed in a front side thereof according to the present invention.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a semiconductor wafer 10 which has a code such as an identification code 12 scribed or otherwise defined therein. The identification code 12 includes a number of alphanumeric characters which may be indicative of, for example, the part number of the integrated circuit devices contained in the wafer 10, the date code of the wafer 10, and/or the lot code of the wafer 10. It should be appreciated that the identification code 12 could also be configured to include other symbols or indicia other than alphanumeric characters. For example, the identification code 12 may be configured to include a bar code or the like.

The semiconductor wafer 10 includes an inactive outer clear out area 14 and an active area 16. The inactive outer clear out area 14 extends radially inwardly a predetermined distance from an outer edge 18 of the semiconductor wafer 10 to an outer edge 22 of the active area 16 so as to define a peripheral area having a width W as shown in FIG. 1. The width W of the inactive outer clear out area 14 may be configured to fit the needs of a given wafer fabrication process. For example, the width W of the inactive outer clear out area 14 may possess a magnitude of 1–4 millimeters. Preferably, the width W of the inactive outer clear out area 14 possesses a magnitude of 2–3 millimeters.

The inactive outer clear out area 14 is a "clear out" area which is utilized as a resist edge bead removal region. In particular, during fabrication of the semiconductor wafer 10, photoresist is not patterned within the inactive outer clear out area 14 of the semiconductor wafer 10 in order to prevent "wrap around" of the resist. Wrap around is a condition which occurs when photoresist is coated too closely to the outer edge of a wafer (i.e. the outer edge 18) which allows the resist to "wrap around" to the back side of the wafer. Moreover, the inactive outer clear out area 14 is utilized as a tool clamp region in which a wafer handling tool such as a clamping tool device associated with an etcher engages the semiconductor wafer 10. Hence, what is meant herein by the term "inactive outer clear out area" is a relatively narrow area (e.g. 1–4 millimeters in width) along the outer periphery of the semiconductor wafer 10 that a wafer designer intentionally leaves devoid of active dies during wafer layout design in order to provide for either a resist edge bead removal region and/or a tool clamp region.

The active area 16 of the semiconductor wafer 10 includes a number of active dies 20. In particular, the fabrication process deposits or otherwise fabricates various patterned layers within the active area 16 so as to fabricate or otherwise construct the active dies 20. It should be appreciated that each of the active dies 20 will be singulated and packaged so as to form an integrated circuit device at the completion of the fabrication process. Hence, what is meant herein by the term "active area" is the inner area of the semiconductor wafer 10 (i.e. the area inside of the inactive outer clear out area 14) in which the active dies 20 are fabricated.

As shown in FIG. 1, the identification code 12 possesses an arcuate shape so as to be completely contained within the inactive outer clear out area 14 of the semiconductor wafer 10, whereas each of the active dies 20 is completely contained in the active area 16 of the semiconductor wafer 10. What is meant herein by the term "completely contained" in regard to the identification code 12 is that the entire identification code 12 (including each alphanumeric character included therein) is positioned in the inactive outer clear out area 14 of the semiconductor wafer 10 and that no part of the identification code 12 extends into the active area 16. Moreover, what is meant herein by the term "completely contained" in regard to the each of the active dies 20 is that the entire active die 20 is positioned in the active area 16 of the semiconductor wafer 10 and that no part of the active die 20 extends into the inactive outer clear out area 14. Yet further, what is meant herein by the term "arcuate" in regard to the shape of the identification code 12 is that the alphanumeric characters associated with the code 12 are arranged in a bow or curved shape which substantially conforms to the outer periphery or edge 18 of the semiconductor wafer 10.

Figure 2:
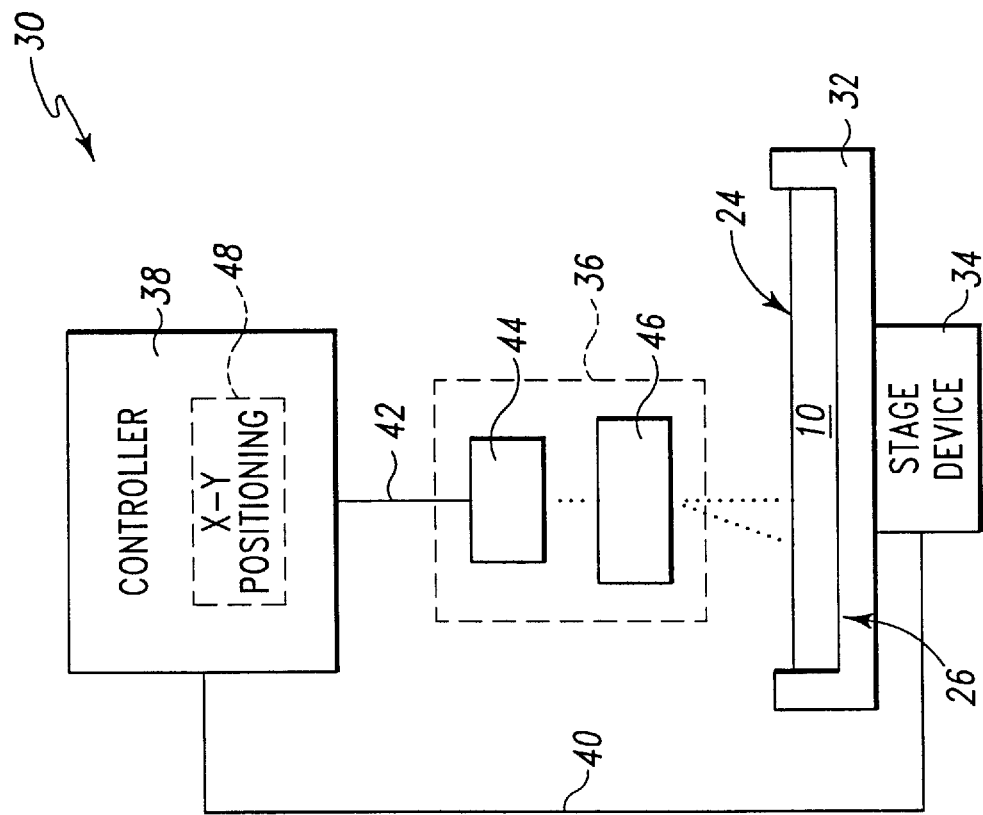
FIG. 2 a diagrammatic view showing a laser scribing system which incorporates the features of the present invention therein.
Figure 2:
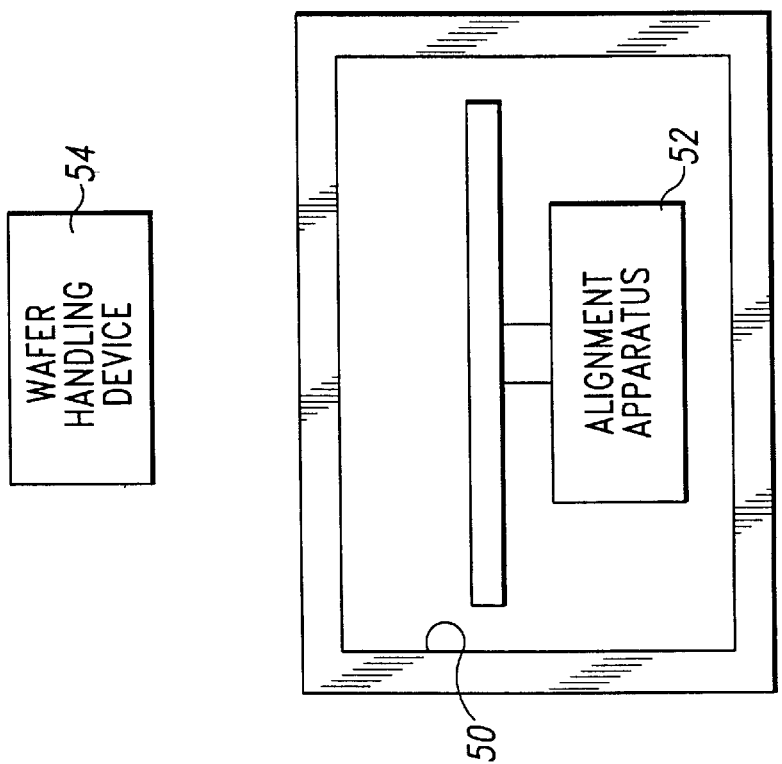

In order to scribe the identification code 12 in the inactive outer clear out area 14 of the semiconductor wafer 10, a laser scribing system 30 (see FIG. 2) according to the present invention scribes alphanumeric characters in a front side 24 of the semiconductor wafer 10. The scribing system 30 includes a wafer chuck 32 secured to a movable stage device 34, a laser device 36, and a controller 38. The wafer chuck 32 engages a back side 26 of the semiconductor wafer 10 in order to secure the wafer 10 therein. Moreover, the wafer chuck 32 is non-movably secured to the stage device 34. Hence, movement of the stage device 34 causes movement of the wafer chuck 32 and hence the semiconductor wafer 10 secured therein.

The laser device 36 is electrically coupled to the controller 38 via a signal line 42 and is positioned such that laser beams generated by a laser source unit 44 included in the laser device 36 are impinged or otherwise directed on the front side 24 of the semiconductor wafer 10 when the wafer 10 is positioned in the wafer chuck 32. Preferably, the laser source unit 44 is configured as an excimer laser source unit which generates pulsed laser beams; however, the laser source unit 44 may alternatively be configured to generate a continuous laser beam. Hence, as used herein, the term "laser beam" refers to either a pulsed or continuous laser beam. Moreover, the laser device 36 includes beam positioning, focusing, and scanning optics 46 such that a laser beam may be scanned on the front side 24 of the semiconductor wafer 10 at predetermined locations thereof. For example, the laser device 36 is preferably configured as a raster scanning laser device which is capable of raster scanning a laser beam on the front side 24 of the semiconductor wafer 10. One such laser raster scanner which is suitable for use as the laser device 36 of the present invention is an Alta 3500 Raster Scanner which is commercially available from Etec Systems, Incorporated of Hayward, Calif.

Pulsed laser beams generated by the laser device 36 cause ablation of the front side 24 of the semiconductor wafer 10. Hence, laser beams generated by the laser device 36 may be utilized to scribe alphanumeric characters in the inactive outer clear out area 14 of the semiconductor wafer 10 thereby creating the identification code 12. In particular, when the semiconductor wafer 10 is positioned in the wafer chuck 32, laser beams generated by the laser device 36 may be impinged on the inactive outer clear out area 14 of the wafer 10 so as to ablate the front side 24 of the wafer in predetermined locations. As shall be described below, the stage device 34 may be operated so as to move the wafer chuck 32 and hence the semiconductor wafer 10 in predetermined movement patterns under the laser device 36 such that the laser beams generated by the laser device 36 scribe the alphanumeric characters associated with the identification code 12 into the inactive outer clear out area 14 of the semiconductor wafer 10.

It should be appreciated that the laser device 36 may be operated to scan the inactive outer clear out area 14 of the semiconductor wafer 10 for a predetermined period of time in order to ablate the front side 24 of the wafer 10 for an amount of time necessary to completely scribe each of the alphanumeric characters associated with the identification code 12 in the inactive outer clear out area 14. In particular, the controller 38 controls the laser device 36 via the signal line 42 such that the laser device 36 raster scans the front side 24 for a predetermined period of time. During such a predetermined period of time, laser beams generated by the laser device 36 are impinged on the front side 24 of the wafer 10 such that material is ablated from the wafer 10 within the inactive outer clear out area 14 thereof so as to define the alphanumeric characters associated with the identification code 12. After the predetermined period of time, the controller 38 communicates with the laser device 36 such that the laser device 36 is deactuated thereby causing the laser device 36 to cease to emit laser beams which in turns ceases ablation of the front side 24 of the semiconductor wafer 10.

The stage device 34 is electrically coupled to the controller 38 via a signal line 40. The controller 38 communicates movement control signals to the stage device 34 via the signal line 40 in order to control movement of the stage device 34 so as to position the stage device 34 in predetermined locations relative to the laser device 36. In particular, the controller 38 executes an X-Y positioning routine 48 which plots or otherwise maps the X-Y incremental movements of the stage device 34 which are required in order to move the stage device 34 under the laser device 36 in a manner so as to generate each of the alphanumeric characters associated with the identification code 12 when laser beams from the laser device 36 are impinged on the front side of the wafer 10. The X-Y positioning routine 48 may be, for example, configured somewhat similar to plotting and mapping routines which are utilized by commercially available plotters and laser printers for printing characters and patterns on paper or the like.

Figure 3:
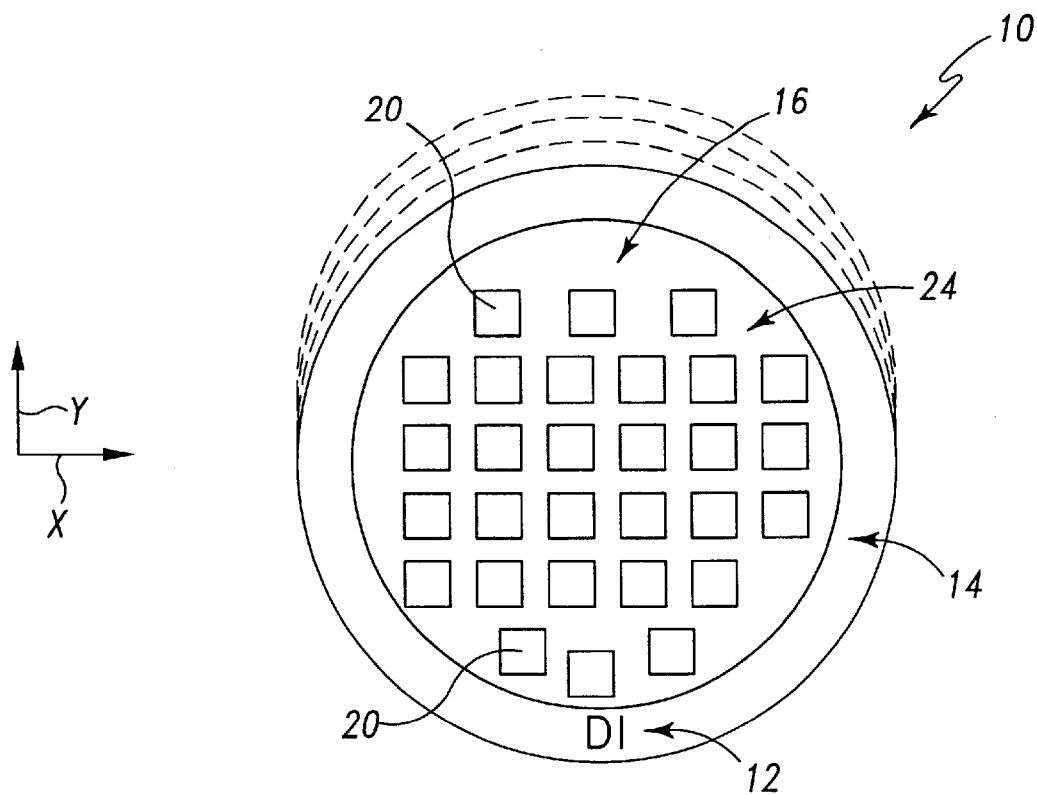
FIG. 3 is a diagrammatic view showing movement of the semiconductor wafer of FIG. 1 in order to scribe a first portion of the letter "L"
Figure 4:
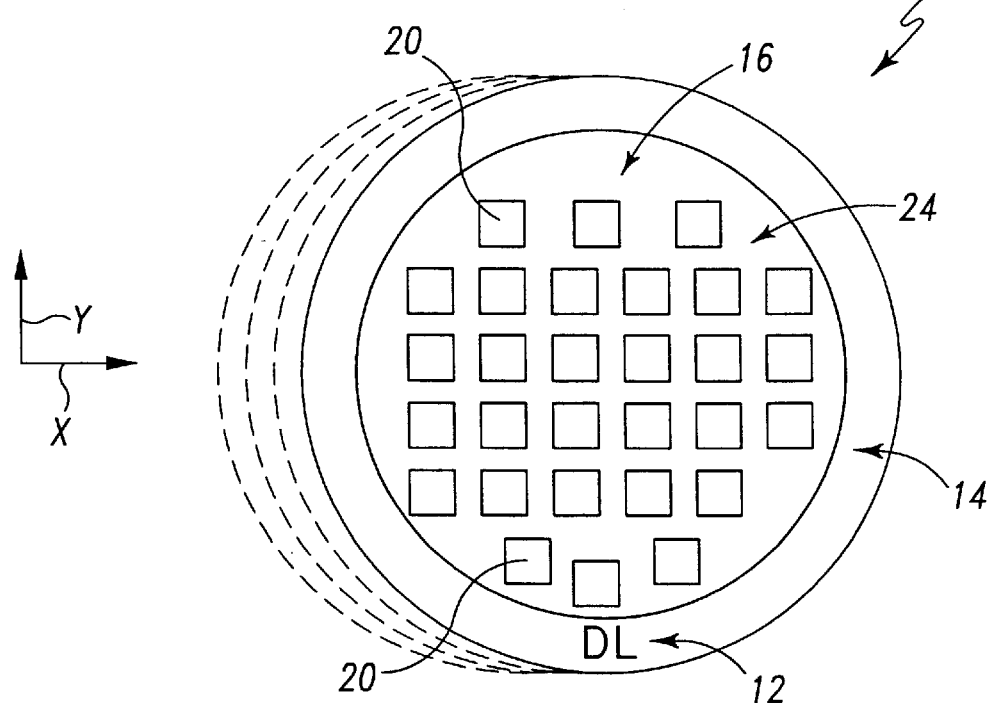
FIG. 4 is a view similar to FIG. 3, but showing movement of the semiconductor wafer in order to scribe a second portion of the letter "L"

For example, as shown in FIGS. 3–4, in order to generate the letter "L", the X-Y positioning routine 48 first causes movement of the stage device 34 in the Y-direction (as shown in FIG. 3) in order to scribe the vertical line associated with the letter "L". It should be appreciated that during such movement, laser beams from the laser device 36 are impinged on the inactive outer clear out area 14 of the semiconductor wafer 10 thereby selectively ablating wafer material so as to generate the vertical line associated with the letter "L". Once the vertical line associated with the letter "L" has been scribed in the semiconductor wafer 10, the X-Y positioning routine 48 causes movement of the stage device 34 in the X-direction (as shown in FIG. 4) in order to scribe the horizontal line associated with the letter "L" in the manner previously described in reference to the vertical line associated with the letter "L".

Figure 5:
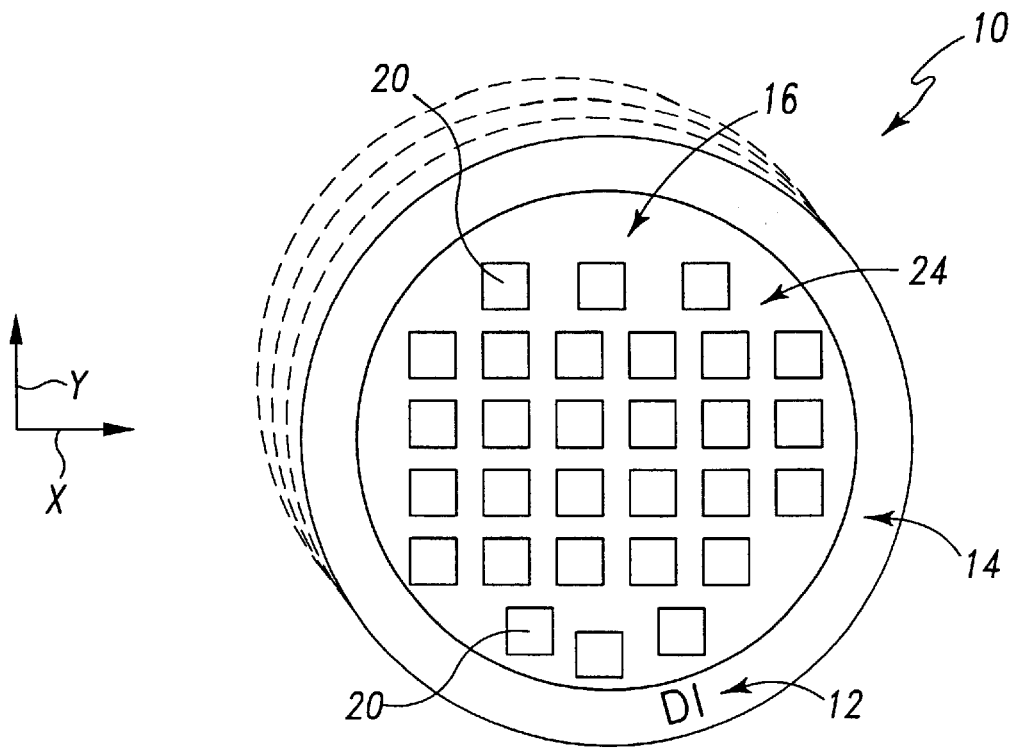
FIG. 5 is a view similar to FIG. 3, but showing movement of the semiconductor wafer in order to scribe the first portion of the letter "L" in a manner so as to define an arcuate-shaped identification code.
Figure 6:
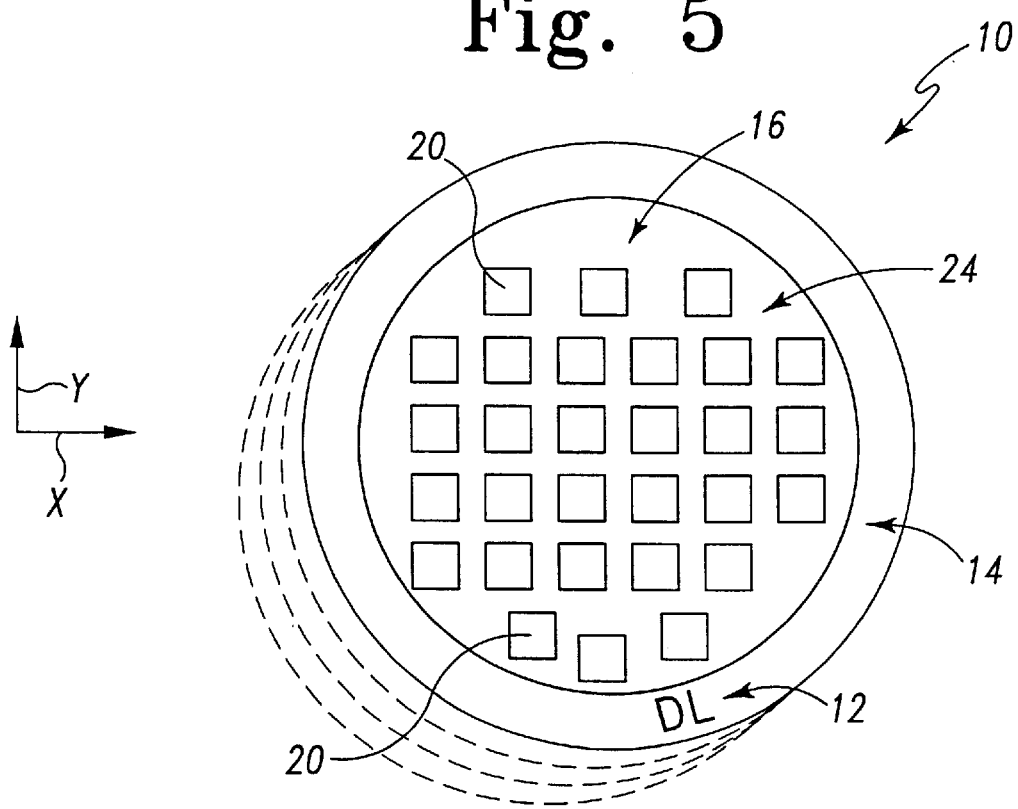
FIG. 6 is a view similar to FIG. 5, but showing movement of the semiconductor wafer in order to scribe the second portion of the letter "L" in a manner so as to define the arcuate shaped identification code.

It should be appreciated that in order to generate the arcuate shaped identification code 12 shown in FIG. 1, in addition to movement in the Y-direction, the X-Y positioning routine 48 causes small, predetermined incremental movements in the X-direction during scribing of the vertical line associated with the letter "L" (see FIG. 5). Similarly, in addition to movement in the X-direction, the X-Y positioning routine 48 causes small, predetermined incremental movements in the Y-direction during scribing of the horizontal line associated with the letter "L" (see FIG. 6) in order to generate the arcuate shaped identification code 12.

It should be appreciated that each of the other alphanumeric characters (e.g. letters "A–Z" and numbers "0–9") can be scribed in a similar manner. In particular, the X-Y positioning routine 48 may be utilized to selectively cause incremental movement of the stage device 34 so as to cause a desired alphanumeric character to be scribed in the inactive outer clear out area 14 of the semiconductor wafer 10.

In operation, during fabrication of the semiconductor wafer 10, the scribing system 30 may be utilized to scribe the identification code 12 in the inactive outer clear out area 14 of the front side 24 of the semiconductor wafer 10. In particular, the semiconductor wafer 10 is first positioned in an alignment chamber 50 so as to be aligned by a coarse alignment apparatus 52. The coarse alignment apparatus 52 may be any known coarse alignment apparatus which has, for example, an alignment accuracy of within one millimeter (i.e. ±1 mm) of its target. Examples of a coarse alignment apparatus which is suitable for use as the coarse alignment apparatus 52 of the present invention include the coarse alignment apparatus included in a model number 9600 plasma etching system which is commercially available from LAM Research Corporation of Fremont, Calif. or the coarse alignment apparatus included in a Centura model plasma etching systems which are commercially available from Applied Materials of Santa Clara, Calif. Once the semiconductor wafer 10 has been aligned by the coarse alignment apparatus 52, a wafer handling device such as a robotic arm mechanism 54 or the like transfers the semiconductor wafer 10 from the alignment chamber 50 to the wafer chuck 32. In particular, once the semiconductor wafer 10 has been aligned by the coarse alignment apparatus 52, the robotic arm mechanism 54 removes the semiconductor wafer 10 from the coarse alignment apparatus 52 and hence the alignment chamber 50, and thereafter places the semiconductor wafer 10 in the wafer chuck 32.

Once positioned in the wafer chuck 32, the controller 38 executes the X-Y positioning routine 48 which plots or otherwise maps the X-Y incremental movements of the stage device 34 which are required in order to move the stage device 34 under the laser device 36 in a manner so as to generate each of the alphanumeric characters associated with the identification code 12 when laser beams from the laser device 36 are impinged on the front side of the wafer 10. In particular, the controller 38 maps the target location of each of the alphanumeric characters associated with arcuate-shaped identification code 12. Thereafter, the controller 38 operates the laser device 36 so as to impinge laser beams on the front side 24 of the semiconductor wafer 10. As the laser beams from the laser device 36 are impinged on the front side 24 of the wafer 10, the controller 38 controls the movement of the stage device 34 such that the alphanumeric characters associated with the arcuate-shaped identification code 12 are ablated in the inactive outer clear out area 14 of the semiconductor wafer 10 such that the identification code 12 is completely contained within the inactive outer clear out area 14 of the semiconductor wafer 10.

Figure 7:
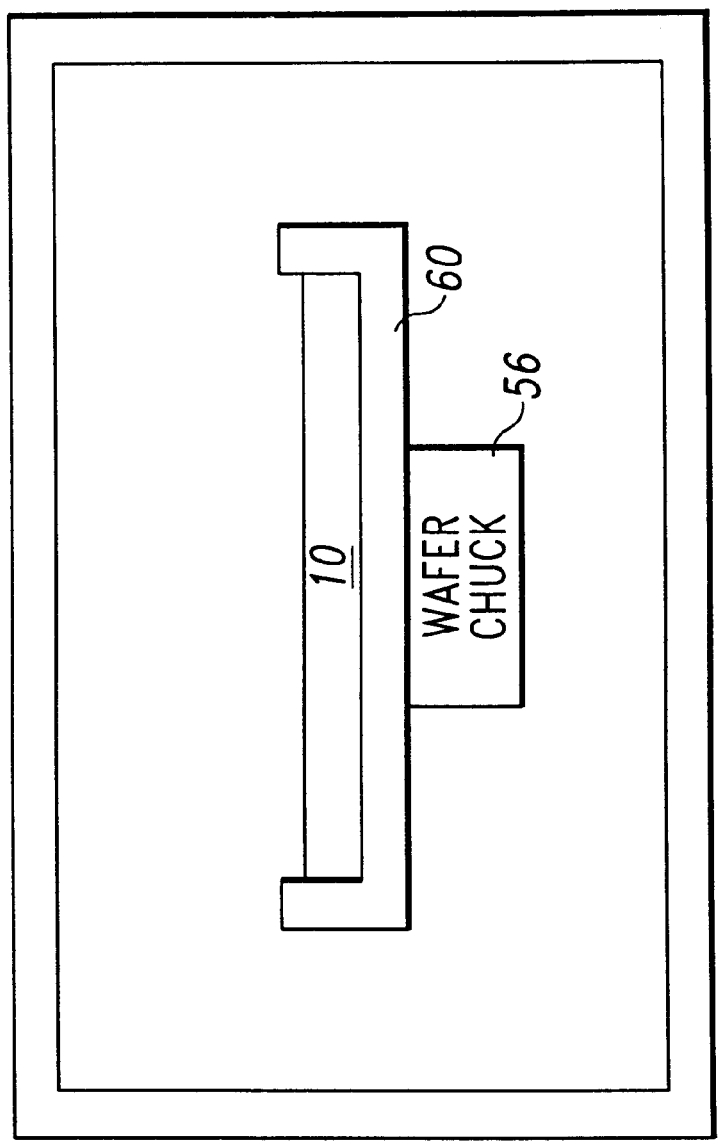
FIG. 7 is a diagrammatic view of a plasma etcher which may be utilized to etch the semiconductor wafer of FIG. 1.
Figure 8:
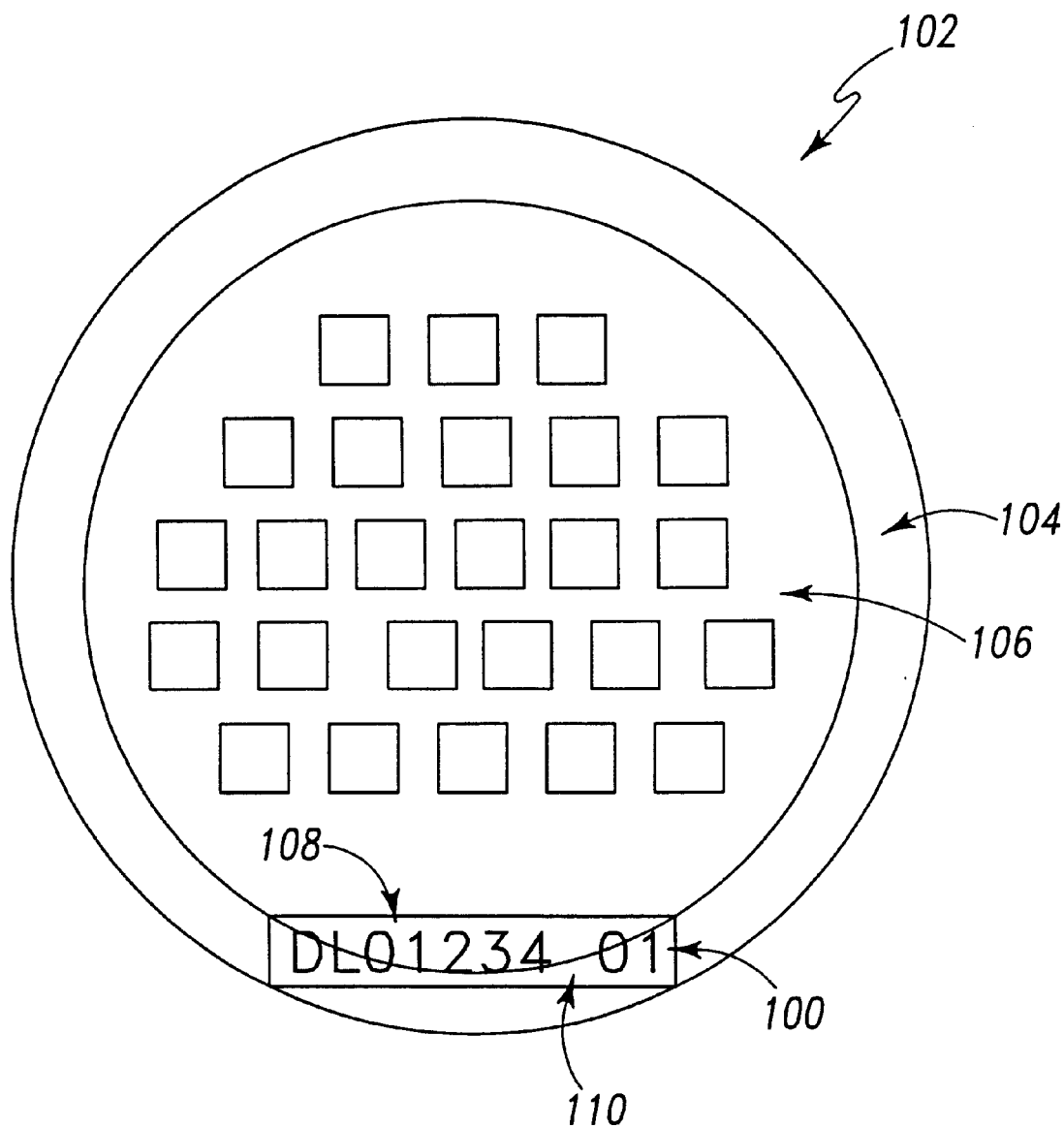
FIG. 8 is a plan view of a semiconductor wafer which was scribed with a prior art laser scribing system.

Once the identification code 12 has been scribed in the semiconductor wafer 10 in the manner described above, the wafer 10 is then suitable for presentation to fabrication equipment for subsequent fabrication thereof. For example, as shown in FIG. 7, the semiconductor wafer 10 may subsequently be positioned in a wafer chuck 56 associated with an etcher such as a plasma etcher 58 by a material handling device such as a robotic arm (not shown). It should be appreciated that when positioned in the wafer chuck 56, a retaining device such as clamping tool device 60 clamps or otherwise contacts the inactive outer clear out area 14 of the semiconductor wafer 10 so as to retain the wafer 10 in the wafer chuck 56.

Hence, as described above, the scribing system 30 provides numerous advantages over systems which have heretofore been designed for scribing an identification code in a semiconductor wafer 10. For example, the scribing system 30 of the present invention may be utilized to scribe the identification code 12 in the inactive outer clear out area 14 of the wafer 10 such that the identification code 12 is completely contained within the inactive outer clear out area. As described above, such a configuration advantageously eliminates the need to scribe a portion of the identification code in the active area 16 of the wafer 10 thereby increasing the usable space within the active area 16 which may be utilized for fabrication of active dies 20.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

For example, it should be appreciated that although the stage device 34 is herein described as being moveable relative to the laser device 36, and has significant advantages associated therewith in the present invention, certain of such advantages may be achieved by other configurations. For example, the stage device 34 and hence the wafer chuck 32 may be held stationary while the laser device 36 is moved relative to the wafer chuck 32. Moreover, both the wafer chuck 32 and the laser device 36 may be held stationary, and the positioning of the laser beams impinged on the inactive outer clear out area 14 of the wafer 10 may be accomplished by use of an additional mirror array (not shown) or other type of additional positioning optics.

What is claimed is:

1. A method of fabricating a semiconductor wafer having an active area with a number of active dies fabricated thereon, comprising:
   (a) generating a laser beam with a laser device; and
   (b) scribing a code in an inactive outer clear out area of a first side of said wafer with said laser beam such that said code is completely contained within said inactive outer clear out area of said wafer,
   wherein said inactive outer clear out area (i) surrounds said active area, (ii) is devoid of said active dies, and (iii) is substantially coplanar with said active area.

2. The method of claim 1, wherein (b) includes ablating a first side of said wafer so as to scribe said code in said inactive outer clear out area of said wafer.

3. The method of claim 1, wherein:
   a second side of said wafer is engaged by a movable stage device during (b), and
   (b) includes positioning said stage device in a number of predetermined locations relative to said laser device so as to scribe said code in said inactive outer clear out area such that said code possesses an arcuate shape.

4. The method of claim 1, wherein said inactive outer clear out area of said wafer includes a resist edge bead removal region of said wafer.

5. The method of claim 1, wherein (b) includes raster scanning said laser beam in said inactive outer clear out area of said first side of said wafer.

6. A method of fabricating a semiconductor wafer having (i) a first side, (ii) a second side, (iii) an active area, and (iv) an inactive outer clear out area, comprising:
   (a) fabricating a number of active dies on said first side of said wafer such that (i) each of said number of active dies is completely contained within said active area of said wafer and (ii) said inactive outer clear out area (A) surrounds said active area, (B) is devoid of said active dies, and (C) is substantially coplanar with said active area;
   (b) positioning said wafer on a movable stage device configured to engage said second side of said wafer;
   (c) generating a laser beam with a laser device; and
   (d) positioning said stage device in a number of predetermined locations relative to said laser device so as to scribe a code in said inactive outer clear out area of said wafer with said laser beam such that said code is completely contained within said inactive outer clear out area of said wafer.

7. The method of claim 6, wherein said inactive outer clear out area of said wafer includes a resist edge bead removal region of said wafer.

8. The method of claim 6, wherein:
   (d) includes positioning said stage device in a number of predetermined locations relative to said laser device so as to scribe said code in said inactive outer clear out area such that said code possesses an arcuate shape.

9. The method of claim 6, wherein (d) includes ablating said first side of said wafer so as to scribe said code in said inactive outer clear out area of said wafer.

10. The method of claim 6, further comprising:
    (e) engaging said inactive outer clear out area of said wafer with a clamping tool device during (a).

11. The method of claim 6, wherein (d) includes raster scanning said laser beam in said inactive outer clear out area of said wafer.

12. An arrangement for scribing a code, comprising:

a semiconductor wafer which includes (i) a first side, (ii) a second side, (iii) an active area having a number of active dies fabricated thereon, and (iv) an inactive outer clear out area which (A) surrounds said active area, (B) is devoid of said active dies, and (C) is substantially coplanar with said active area;

a movable stage device configured to engage said wafer; and a laser device positioned such that a laser beam generated by said laser device is impinged on said first side of said wafer when said wafer is engaged by said movable stage device, wherein (i) said movable stage device is further configured to position said wafer in a number of predetermined locations relative to said laser device such that impingement of said laser beam on said first side of said wafer causes said code to be scribed in said inactive outer clear out area of said first side of said wafer, and (ii) said code is completely contained within said inactive outer clear out area of said wafer.

13. The apparatus of claim 12, wherein:

said number of predetermined locations of said movable stage device causes said code to include a number of alphanumeric characters, and each of said number of alphanumeric characters is completely contained within said inactive outer clear out area of said first side of said wafer such that said code possesses an arcuate shape.

14. The apparatus of claim 12, wherein said laser device is configured to ablate said code in said inactive outer clear out area of said wafer.

15. The apparatus of claim 12, further comprising a wafer handling device, wherein said wafer handling device is configured to engage said wafer within said inactive outer clear out area so as to remove said wafer from said stage device.

16. The apparatus of claim 12, wherein said laser device includes a raster scanning laser device which is configured to raster scan said laser beam on said first side of said wafer when said wafer is positioned within said stage device.

* * * * *